United States Patent
Schimmel

(10) Patent No.: US 10,359,547 B2
(45) Date of Patent: Jul. 23, 2019

(54) OPTICAL DEVICE AND USE OF THE DEVICE

(71) Applicants: BADEN-WÜRTTEMBERG STIFTUNG GGMBH, Stuttgart (DE); KARLSRUHER INSTITUT FÜR TECHNOLOGIE, Karlsruhe (DE); Thomas Schimmel, Karlsruhe (DE)

(72) Inventor: Thomas Schimmel, Karlsruhe (DE)

(73) Assignee: BADEN-WURTTEMBERG STIFTUNG GGMBH (DE)

( * ) Notice: Subject to any disclaimer, the term of this patent is extended or adjusted under 35 U.S.C. 154(b) by 0 days.

(21) Appl. No.: 15/578,886

(22) PCT Filed: Jun. 3, 2016

(86) PCT No.: PCT/EP2016/000925
§ 371 (c)(1),
(2) Date: Dec. 1, 2017

(87) PCT Pub. No.: WO2016/192859
PCT Pub. Date: Dec. 8, 2016

(65) Prior Publication Data
US 2018/0156948 A1    Jun. 7, 2018

(30) Foreign Application Priority Data
Jun. 3, 2015 (DE) .................. 10 2015 006 873

(51) Int. Cl.
*G02F 1/03* (2006.01)
*G02B 5/00* (2006.01)
(Continued)

(52) U.S. Cl.
CPC .......... *G02B 5/008* (2013.01); *H01L 51/0595* (2013.01); *B82Y 10/00* (2013.01); *G02B 6/1226* (2013.01)

(58) Field of Classification Search
CPC ...... G02B 5/008; G02B 6/1226; B82Y 10/00; H01L 51/0595
(Continued)

(56) References Cited

U.S. PATENT DOCUMENTS 6,937,804 B2    8/2005    McCoy et al.
7,947,485 B2    5/2011    Wu et al.
(Continued)

FOREIGN PATENT DOCUMENTS

WO    2014149004    9/2014

OTHER PUBLICATIONS

International Search Report and Written Opinion dated Sep. 8, 2016 issued in corresponding International Application No. PCT/EP2016/000925.
(Continued)

*Primary Examiner* — William Choi
(74) *Attorney, Agent, or Firm* — Onello & Mello LLP

(57) ABSTRACT

The present invention relates to an optical device (100) and a use of the optical device (100). The optical device (100) comprises: —a source electrode (2); —a drain electrode (4); —a gap area (6) between the source electrode (2) and the drain electrode (4); —a cluster (8) being positioned in the gap area (6) for connecting and disconnecting the source electrode (2) and the drain electrode (4) and for changing optical and/or plasmonic properties of the gap area (6); and an optical coupling element (10) for bringing light into and out of the gap area (6).

28 Claims, 3 Drawing Sheets

(51) Int. Cl.
  *H01L 51/05* (2006.01)
  *B82Y 10/00* (2011.01)
  *G02B 6/122* (2006.01)

(58) Field of Classification Search
  USPC .......................................................... 359/241
  See application file for complete search history.

(56) References Cited

U.S. PATENT DOCUMENTS

| | | |
|---|---|---|
| 9,627,562 B2 | 4/2017 | Zhang et al. |
| 2004/0046167 A1 | 3/2004 | McCoy et al. |
| 2006/0275778 A1 | 12/2006 | Wu et al. |
| 2012/0211368 A1 | 8/2012 | Schimmel et al. |
| 2016/0005894 A1 | 1/2016 | Zhang et al. |

OTHER PUBLICATIONS

Kim, Jin Tae et al., "Graphene-based photonic wave guide devices", Optomechatronic Micro/Nano Devices and Componnents III: Oct. 8-10, 2007, Lausanne, Switzerland; (Proceedings of Spie, ISSN 0277-786X), SPIE, Bellinghan, Wash, vol. 8988, Mar. 7, 2014, pp. 898802-898802.

H. Gleiter et al, Nanostructured solids—From nano-glasses to quantum transistors, Nano Today (2014) 9, 17-68.

R. Maul et al., "Memory effects in electrochemically gated metallic point contacts", Applied Physics Letters 100, 203511 (2012).

Christian Obermair, et al., "The atomic force microscope as a mechano-electrochemical pen", Beilstein Journal of Nanotechnology 2, 2011, 659-664.

Christian Obermair, et al., "Lifetime analysis of individual-atom contacts and crossover to geometric-shell structures in unstrained silver nanowires", Beilstein Journal of Nanotechnolgy 2, 2011, 740-745.

Fangqing Xie, et al., "Multilevel Atomic-Scale Transistors Based on Metallic Quantum Point Contacts", Advanced Materials, 22, 2010, 2033-2036.

C. Obermair et al., "The Single-Atom Transistor: Perspectives for Quantum Electronics on the Atomic-Scale", Europhysics News, Invited Article, 41(4) Jul.-Aug. 2010, 25-28.

S. Zhong et al., "Periodical Nanostructured Multiline Copper Films Self-Organized by Electrodeposition: Structure and Properties.", Journal of Nanoscience and Nanotechnology vol. 10, 2010, 6144-6149.

S. Zhong et al., "Growth and Branching Mechanisms of Electrochemically Self-Organized Mesoscale Metallic Wires.", Crystal Growth & Design Communication, vol. 10, 2010, 1455-1459.

F. Q. Xie et al. "Conductance of atomic-scale Pb contacts in an electrochemical environment"., Physical Review B 82, 075417 2010.

Sheng Zhong et al., "Nanoscale Twinned Copper Nanowire Formation by Direct Electrodeposition", Small 2009, 5, No. 20, 2265-2270.

Christian Obermair et al., "Single-Atom Transistors: Switching An Electrical Current With Individual Atoms", Invited Article, Nanoscale Phenomena: Fundamentals and Applications, NanoScience and Technology, DOI 10.1007/973-3-642-00708-8_11, Springer-Verlag Berlin Heidelberg 2009.

F. Q. Xie et al., "Independently Switchable Atomic Quantum Transistors by Reversible Contact Reconstruction.", Nano Letters vol. 8, No. 12, 4493-4497, 2008.

F. Xie et al., "Pre-selectable integer quantum conductance of electrochemically fabricated silver point contacts", Applied Physics Letters 93 (4), 043103, 2008.

TH. Schimmel et al., "Quantenelektronik: Weltweit erster atomarer Transistor", Elektronik 55 (20), 2006, 14-17.

Christian Obermair et al., "Quantized Conductance in Atomic-Scale Point Contacts Formed by Local Electrochemical Deposition of Silver" Invited Paper in: Molecular Nanowires and other Quantum Objects, Eds. A.S. Alexandrov et al., NATO Science Series: II, Mathematics, Physics and Chemistry (Kluwer Academic Press, Dordrecht 2004).

F.Q. Xie et al., "Switching an electrical current with atoms: the reproducible operation of a multi-atom relay", Solid State Communications 132, 2004, 437-442.

F.Q. Xie et al., "Gate-Controlled Atomic Quantum Switch", Physical Review Letters, vol. 93, No. 12, 2004, 128303-1-128303-4.

J. Scholl et al., "Quantum plasmon resonances of individual metallic nanoparticles"., Nature, vol. 483, Mar. 22, 2012, 421-427.

K. Savage et al., "Revealing the quantum regime in tunnelling plasmonics", Nature, vol. 491, 2012, 574-576.

A. Aubry et al., "Interaction between Plasmonic Nanoparticles Revisited with Transformation Optics", Physical Review Letters, 2010, 233901-1-233901-4.

Obermair Christian et al., "The Single-Atom Transistor: Quantum Electronics at Room Temperature",IEEE Conference on Nanotechnology, 9th, 2009, 439-441.

F. Xie, et al., "Elektrische Strome schalten mit einzelnen Atomen", Physik i .u. Z. 6, 159-160 (2006).

Th. Schimmel, et al., Atomare Elektronik: Mit einzelnen Atomen elektrische Strome schalten, Spezial Nanotechnik in: Photonik 6, Dec. 2005.

F.-Q., et al. "Nanotechnologie—VorstoB in atomare Dimensionen", Erdol, Erdgas, Kohle 12, 542-546 (2002); eingeladener Artikel.

OPTICAL DEVICE AND USE OF THE DEVICE

The application claims the benefit of German patent application DE 10 2015 006 873.3 filed on Jun. 3, 2015, the entirety of which is incorporated herein by reference.

MOTIVATION

Micro- and nano-electronics, optics and plasmonics are rapidly developing fields and provide the basis of the current information technologies. These technologies, however, face seven key problems:

With the continuously increasing volume of data processed and transmitted, the energy consumption of computing and data processing is continuously increasing, now having already reached a considerable percentage (approx. 10% in industrial states) of the total electrical energy production. There is an urgent need for lower energy consumption per logical operation. Smaller devices down to miniaturization reaching the level of individual atoms and molecules would allow a drastic reduction in energy consumption.

Ultra-low voltage operation is desired, as the energy consumption typically increases with the square of the operating voltage. Silicon-based micro- and nano-electronics faces limits of low-voltage operation due to the semiconducting gap of semiconductor-based microelectronics.

A coupling of micro- and nanoelectronics with nano-optics and plasmonics provides the problem, that micro- and nanoelectronics are typically based on silicon semiconductor technologies and nano-optics and especially plasmonics involve metals. A common materials platform would be desirable, e.g. by implementing the function of transistors and electronic logical gates with all-metal devices.

The data transmission rates and especially the data processing rates should further increase to cope with the increasing demand for data processing. Electrical data processing rates are reaching technical limits—and an increase in data processing rates (logical operations per second) is often reached only at the cost of an even higher energy consumption per logical operation.

It would be highly desirable to have nanooptical devices and nanoplasmonic devices on the nanometer scale or even at the atomic and molecular scale. Unfortunately, the wavelength of light is of the order of 500 nm, so far preventing to reach this desired length scale. So, unfortunately, nanoelectronics can be small and photonics and plasmonics can be fast, but do not reach the length scale of nanoelectronics.

Electronics and Photonics/Plasmonics on the quantum level would be highly desirable, where the quantized states are provided by the fundamental laws of physics and quantum mechanics, allowing logical operations with quantum levels precisely defined not by the manufacturer of the device, but by the laws of quantum mechanics. So far, such devices typically operate at very low temperatures, preferably in the Milli-Kelvin temperature range. However, an operation of quantum devices at room temperature would be desirable for practical use.

Most of all, a device is still missing and needed that combines nanoelectronic and nanooptical or nanoplasmonic functions within one and the same device and at the same length scale, desirably on the nanometer-scale or even at the atomic scale.

PROBLEMS SOLVED BY THE DISCLOSED INVENTION

These key problems of information processing technologies described above are addressed and solved with the invention disclosed here. With the Atomic-scale Plasmonic Transistor and the Atomic-Scale Photonic Transistor described below (including the cases of the Single-Atom Plasmonic Transistor and the Single-Molecule Plasmonic Transistor), it is possible to combine nano-electronics and nano-photonics and -plasmonics in one and the same device, to reach ultralow energy consumption per logical operation and ultralow operation voltages down to the millivolt range and to combine nano-electronics and nano-photonics and -plasmonics, within one and the same materials platform—by completely and only using abundantly available, environmentally friendly and non-toxic materials.

STATE OF THE ART

A device capable of switching at the atomic scale using a switachable metal junction controlled by a voltage applied to an independent third gate electrode is described in literature [1-21]. This device can be operated down to the single-atom level, using movable metallic atoms in a junction. However, this device does not make use of photonic or plasmonic properties of the junction and does not use the presence of semiconductors, organics, dielectrics or even molecular functionalities (e.g. molecules in the contact or gap area having electronic, optical or mechanical or even actuator properties).

At the same time, it was impressively shown in literature by different groups in recent years that the plasmonic and optical properties of nanoscale entities, especially of metallic nanoscale entities can be changed dramatically by changing the neighbourhood of these entities, e.g. by approaching a second metallic nanoparticle to an existing one. Dramatic changes of the plasmonic and optical properties of such nanoscale entities were observed when distance changes on the nanometer scale were performed at the point of very close approach, and tremendous progress was made concerning the understanding of the coupling of plasmonic modes of different metallic nanoscale entities upon closest approach on the nanometer-scale and even to the point of direct mechanical contact by connecting the two entities [22-24]. However, so far, no device was presented allowing a controlled switching of the plasmonic and optical properties of such entities on the nanometer scale by a controlled and reproducible, externally induced switching of the contact geometry—an atomic scale plasmonic transistor.

DESCRIPTION OF THE INVENTION

Purpose of the disclosed invention is exactly this device—an atomic scale plasmonic transistor, which basically is the combination of controlled switching of a contact between two preferably metallic entities on the nanometer scale or on the atomic or molecular scale with an externally applied gate voltage and the optical or plasmonic read-out of the physical and implicitly also logical state of the device. In this case disclosed here, the changes of the atomic-scale coupling between the two entities induced by the relocation of individual atoms or a group of atoms or a cluster of atoms or a small, nanoscale or microscale entity within the junction, which is controlled by an electrical signal, determines the optical read-out signal. By relocating a single atom or molecule, a group of atoms or molecules or a cluster of atoms or molecules within the gap or cavity between the source and drain electrodes, the two metals are either short-circuited or clearly separated and as a consequence, the plasmonic properties, especially the plasmonic resonances are changed concerning their frequencies, amplitudes and damping.

The atomic-scale plasmonic transistor can be implemented on the basis of the single-atom transistor of the atomic-scale transistor described in Ref. 18-22: An atomic-scale quantum conductance switch allows to open and close an electrical circuit by the controlled and reproducible reconfiguration of individual silver atoms within an atomic-scale junction [18-22]. The only movable parts of the switch are the contacting atoms. The device, which is fabricated by electrochemical deposition of silver atoms, is entirely controlled by an external voltage applied to an independent third gate electrode. Controlled switching in a favorable configuration is performed between a quantized, electrically conducting "on-state" exhibiting a conductance of $G_0=2e^2/h$ ($\approx 1/12.9$ k$\Omega$) or preselectable multiples of this value and an insulating "off-state". The device, which reproducibly operates at room temperature, represents an atomic transistor or relay, opening intriguing perspectives for the emerging fields of quantum electronics and logics on the atomic scale. If this device is combined with an optical read-out, the switching behavior can be induced by a gate voltage as described, but the detection of the state of the switch can be performed by an optical readout, i.e. by detecting the change in the optical or plasmonic properties in the region of the contacting atoms or molecules. This requires coupling out (and in a preferred configuration also coupling in) light into the area where the switching takes place—the term "switching" meaning the local change in the geometric arrangement or the properties of the atom(s) or molecule(s) in the gap between source and drain electrode (the so-called "contacting cluster" or "cluster") which is induced by means of a voltage change or a voltage pulse applied to the gate electrode. The duration of the voltage pulse in a favorable configuration typically is in the range between picoseconds and milliseconds. The height of the voltage pulse preferably is between 0.1 Millivolts and several Volts. The size of the contacting cluster preferably is in the range between one single atom or molecule and several micrometers. Switching can also be induced alternatively by a change in the local electrical or magnetic field or a change in the local electrical field gradient or magnetic field gradient.

To summarize: A three-terminal device is described that allows the controlled opening and closing of a nanoscale gap between two conducting or semiconducting electrodes by means of a control voltage applied to a third electrode, the gate electrode and which also includes an optical read-out, e.g. in the form of a waveguide or a far-field optical detection assembly, e.g. on the basis of an objective or lens and a detector, allowing to detect changes in the optical properties (resonance frequencies, plasmonic modes, optical absorption, damping).

Atomic transistors allow to reversibly open and close a metal contact by controlled rearrangement of a single metal atom ("single atom transistor") or several or a plurality of metal atoms. This can occur in an electrochemical environment by changing the interfacial surface tension between metal—electrolyte in line with a controlled change of the electrochemical potential, but also by reversible electrochemical deposition and dissolution or by electrostatic or magnetic interaction including electrostriction or magnetostriction as well as by external mechanical forces or by electromigration. In all cases a metallic or superconductive contact is controlled and preferably reversibly opened and closed by rearrangement of single or a few atoms or by rearrangement or deformation of a small metal element with a length scale in the atomic range, in the nanometer range (5 nm to 100 nm) or in the sub-micrometer or micrometer range. This opening and closing of a contact is caused by an electrical voltage, an electrical or a magnetic field, a radiation (e.g. electromagnetic radiation), by mechanical or piezo-mechanical or piezo-electrical deformation, or by chemical or electrochemical influences.

In all these cases the reversible, "switchable" establishment of contact between the two metals on the atomic, nanometer or micrometer scale not only causes an opening and closing of an electric circuit, but at the same time also a shift of the plasmonic resonances. Two metallic structures, which are separated from each other by a gap, have different plasmonic properties than in the case in which they are connected together by a small metallic bridge.

Thereby, electronics (e.g. in the form of atomic transistors or in the extreme case of a single atom transistor) and plasmonics (which can be read out optically) can be coupled together in one and the same device. Thus, by adding of an optical read-out possibility, e.g. by means of glass fiber and bandpass filter or other filter or by means of glass fiber and spectrometer, one arrives at a combination and coupling of electronics, plasmonics and optics and opens the new area of plasmonics being switchable on the atomic scale (atomic plasmonics) and the atomic opto-electronics. An atomic transistor, which can be optically read out, e.g. on the basis of silver (with very pronounced plasmonic resonances) or copper, nickel, lead, etc., represents a first such active device (switchable by means of an independent third control-electrode or gate-electrode) of the atomic plasmonics and/or atomic opto-electronics.

An advantage of such a device is also its high read-out speed. While the switching frequencies reach from the physical limit into the range of phonon frequencies and while extremely small masses on springs with high spring constant also show extremely high resonance frequencies, the electrical read-out of the switching state does not keep up with these—in view of the atomic or nanoscopic mechanics conceivable—frequencies. Here, the possibility arises to establish a given switching state of the atomic transistor or other switching element (see above) by means of electrically induced switching, but to realize the read-out via the plasmonic properties of the contact, that is, "switching electronically, reading out plasmonically/optically".

Such plasmonic switches and transistors are not basically limited to the atomic scale, but are also conceivable on the mesoscale and the micrometer-scale. It is also conceivable to use the same or different metals for each of the metal of the one and the other contact and, as the case may be, for the mechanically movable central part, which causes the opening and the closing of the contact (mono-, bi- and tri-metallic switch), or to fabricate one side of the contact from a metal and one side from a semiconductor or to use for one side one (or more or a bundle of the same) metallic or semiconducting carbon nanotube or other nanotube (e.g. Si-based nanotubes). In this case, one would have a mechanical relay which can open and close an electric circuit and whose opening and closing can be, at the same time, verified and read out plasmonically and/or generally by the change in the local optical spectra in the contact area. Optical spectra in the sense of this description shall not be limited to the visible spectral range, but shall generally relate to the range of electromagnetic waves, particularly including the ultraviolet, the infrared and the microwave range.

The principle can also be reversed: By electromagnetic radiation which—preferably in the contact area—is ideally absorbed resonantly, the switching state of the atomic or mesoscopic switch is changed (here, a light-induced cis-trans-isomerization can also be used). This can occur by plasmonic interaction, by resonantly absorbing actuator-molecules in the contact area, which reversibly or ideally reversibly change their geometry by light (e.g. Azo-compounds, Azo-benzene and derivatives) or in the simplest case photothermically—that is by absorption and local heating. The latter variant is not necessarily slow, because the heat capacities in the direct contact area are extremely small and the coupling to the thermal bath is very good, particularly when operating the atomic transistors under liquids or electrolytes.

A practical exemplary embodiment is a configuration as described in the references 18-21 (see, for example: "Switching and Electrical Current with Atoms: the Reproducible Operation of a Multi-Atom Relay", Solid State Communications 132, 437-442 (2004); "F. Q. Xie, L. Niter, Ch. Obermair, and Th. Schimmel:" Gate-controlled atomic quantum switch, Physical Review Letters 93(12), 128303 (2004)), wherein, additionally, an optical read-out is implemented (see FIGS. 1 to 3), for example via a fiber optical coupling-out and coupling-in, a waveguide, particularly a plasmonic waveguide, or via a far-field optics (far-field lenses) which collects/collect, for example by using a microscope objective, light emitted from the contact region or via a near-field optics (near-field lenses) which collects/collect the light in the optical near-field of the source-drain contact area. All these setup variants can collect the light that is emitted from the gap area or contact area between source-electrode and drain-electrode and feed it to a detector for detection and spectral analysis. A monochromator, or for example a band-pass filter, can be used for the spectral analysis. Since for the detection of switching operations only the detection of the changes is important in order to optically verify the preferably electrically induced switching operation in the contact area, it is sufficient to verify a change in the amplitude or the frequency or the polarization in order to optically read out the switching state of, for example, an atomic transistor. The light coming from the contact area, i.e. the area of the contacting clusters of atoms or molecules, can be passed through a color filter or an edge filter or a band-pass filter or a polarizer in order to verify frequency changes or polarization changes due to switching processes via the amplitude of the detected radiation. Hereby, this light does not have to be emitted in the contact area. According to one variant of the setup, light is irradiated monochromatically or broadbandly or polychromatically, and the light coming back from the source-drain contact area is detected.

A usual semiconductor detector is suitable for detection, but also any other detector whose preferably electrical output signal changes with light intensity, light polarization or light frequency. The combination of the detector with an electronic amplification element is preferred.

Also an arrangement of many of such plasmonic transistors (plasmonic transistor array) on one and the same chip or substrate is possible, as well as their combination into logical circuits. Thus, for example, logical NOR, NAND, OR, AND and other logical functions can be realized by the combination of such plasmonic atomic transistors. The combination of common atomic transistors without optical coupling with plasmonic transistors is also possible.

The optically detected changes of the optical properties of the contact area, that are caused during the rearrangement of the cluster in this contact area and/or the switching operation of the atomic transistor can be changes in the plasmon resonance of the plasmons and/or surface plasmons—particularly from metallic parts in the source-drain contact area. It can also be optical absorption and emission properties of molecules in the contact area and in its neighborhood.

The switching of the contacting cluster between source electrode and drain electrode can not only be caused by means of a voltage change or a voltage pulse at the gate electrode. A voltage change or a voltage pulse or a sequence of voltage pulses between source and drain electrode itself, or an external electrical or magnetic or electromagnetic field can also be used for this purpose. In this case, the presence of the gate electrode is not necessary.

The dimensions of the in its configuration and/or in its properties switchable contacting cluster between source and drain electrode can be in the range of single atoms and molecules and can have in the special case of the single atom transistor the dimension of a single, in its position relocatable atom or in the special case of the single molecule transistor the dimension of a single, in its position relocatable or in its properties switchable molecule. It is crucial that in case of the plasmonic or optical transistor on atomic or molecular scale the switching operation of the transistor is additionally or exclusively read out optically and/or that it is even induced optically, and then either read out optically or electrically or both.

The switching operation itself can hereby be caused, for example, by an electrochemical (partial or entire) deposition and/or dissolution of a metal, which is induced by means of an electrical voltage change or by means of a voltage pulse at the control or gate electrode, or by a thereby caused spatial relocation or structural reordering of atoms and molecules or by a thereby caused chemical change of the atoms and molecules in the contact area (isomerization, change of the redox-state) or by a change of the doping of material in the contact area.

Other features and advantages of the subject-matter described herein will be apparent from the following description relating to the drawings and from the claims. It should be understood that even though embodiments are separately described, single features and functionalities thereof may be combined without prejudice to additional embodiments.

Preferred embodiments are exemplarily described the following figures.

Figure 1:
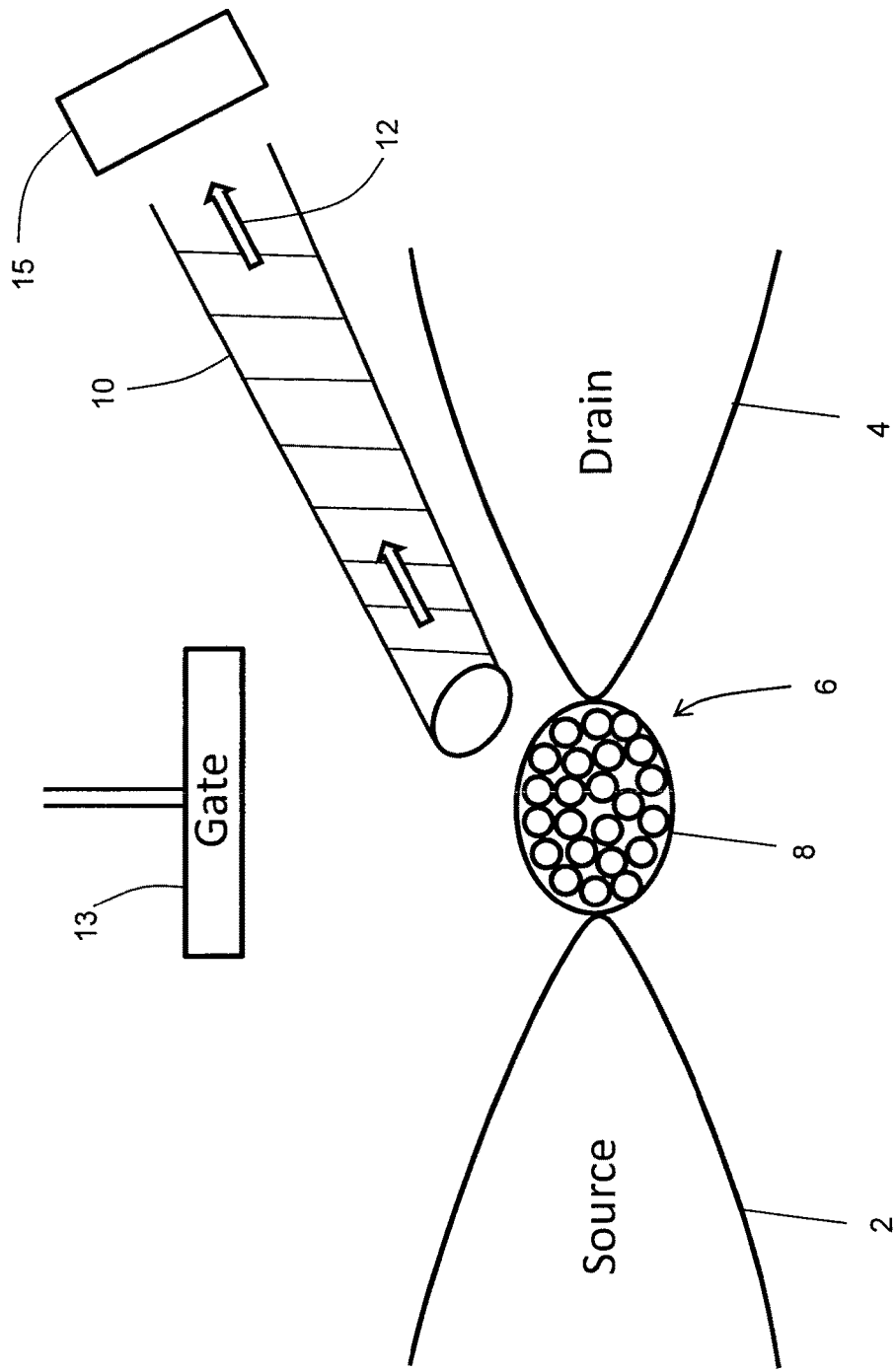
FIG. 1 shows a schematic representation of a device according to an exemplary embodiment.

FIG. 1 illustrates a schematic representation of a device 100 according to an exemplary embodiment of the present application. The device 100 is an optical and/or plasmonic device which acts as a switch or transistor. Accordingly, the device 100 is an optical and/or plasmonic switch or an optical and/or plasmonic transistor.

The device 100 comprises a source electrode 2, a drain electrode 4 and a gate electrode 13. The source electrode 2 and the drain electrode 4 are separated by a gap or a gap area 6. A so-called cluster 8 is located in the gap area 6. The cluster 8 comprises one or more atoms and/or molecules. In other words, the cluster 8 is a cluster of atoms and/or molecules in the gap 6 between the source electrode 2 and the drain electrode 4.

The atoms and/or molecules are conductive. In particular, the atoms may be metal atoms and the molecules may be Azo-benzene molecules or derivatives of these. Depending on the arrangement of the atoms and/or molecules of or in the cluster 8, the cluster 8 can adopt at least two different states. In one state, the atoms and/or molecules of the cluster 8 are arranged such that the source electrode 2 and the drain electrode 4 are electrically connected or short-circuited. In another state, the atoms and/or molecules of the cluster 8 are arranged such that the source electrode 2 and the drain electrode 4 are electrically disconnected, i.e., isolated from each other. Thus, by means of the cluster 8, the source electrode 2 and the drain electrode 4 can be connected and disconnected depending on the state of the cluster 8. The different states of the cluster 8 cause different optical and/or plasmonic properties of the gap area 6.

The contacting cluster 8 or the states of the contacting cluster 8 is/are switchable by a voltage applied at the gate electrode 13. Accordingly, by means of the gate electrode 13 the state of the cluster 8, and thereby the optical and/or plasmonic properties of the gap area 6, can be changed or switched. It is noted, however, that the cluster 8 may alternatively or additionally be switched by other means such as a source-drain voltage, a magnetic field, an optical signal or by mechanical or chemical influences, or by a change of the doping of material (particularly the atoms and/or molecules of the cluster 8) in the gap area 6.

The device 100 further comprises an optical fiber as an optical coupling element 10 for bringing light out of the gap area 6. The coupling element 10 may comprise fiber optics and/or a waveguide, particularly a plasmonic waveguide. The coupling element 10 can also be used to guide light to the gap area 6.

The device 100 further comprises a detection system 15 for detecting changes of the optical and/or plasmonic properties of the gap area 6. The detection system 15 is adapted to optically read out the state of the cluster. The detection system 15 may comprise an optical detector and/or a color filter and/or an edge filter and/or a band-pass filter and/or a polarizer and/or a spectral analyzer.

Figure 2:
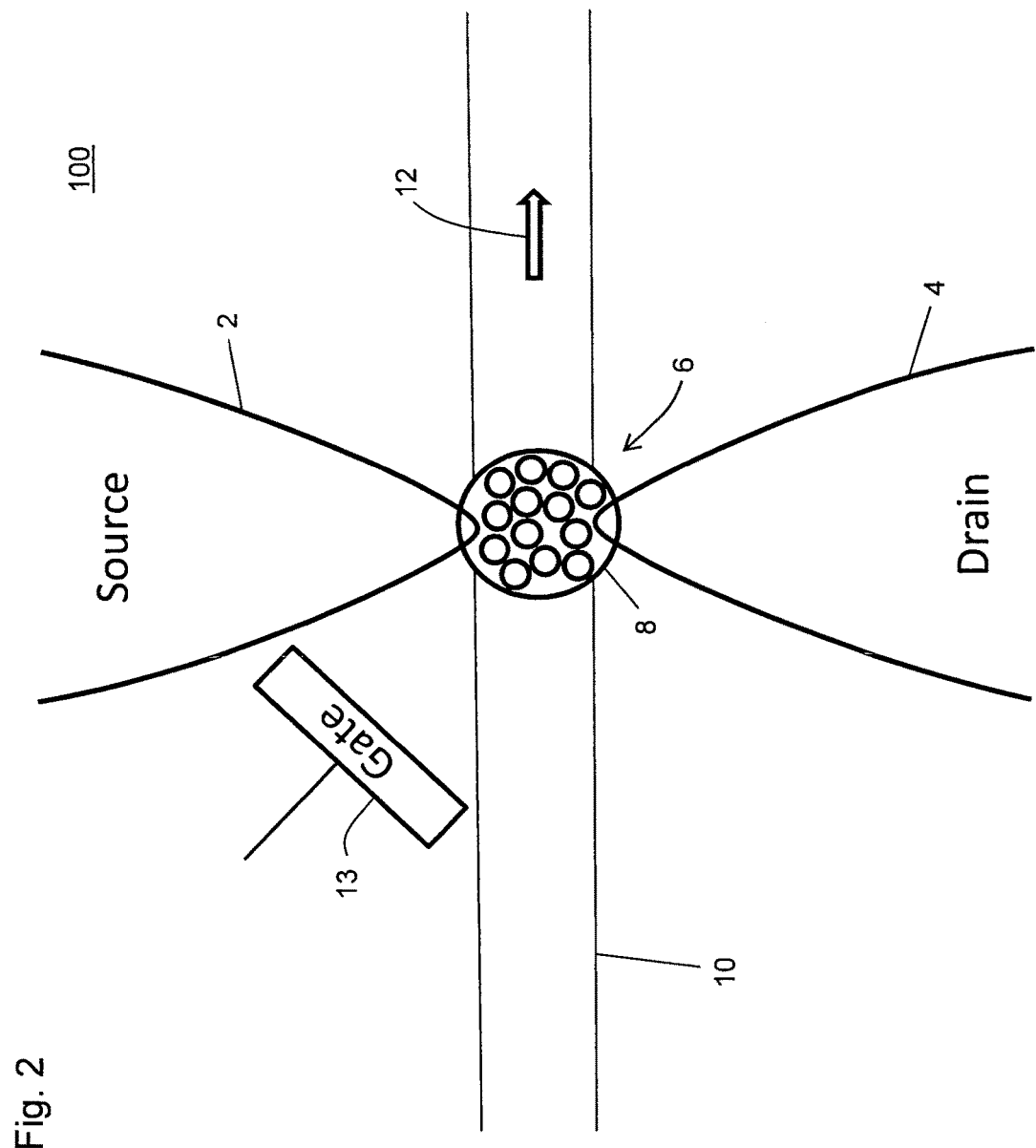
FIG. 2 shows a schematic representation of a perpendicular geometry or cross geometry of a device according to an exemplary embodiment.

FIG. 2 illustrates a schematic representation of a perpendicular geometry or cross geometry of a device 100 according to an exemplary embodiment of the present application. In this perpendicular geometry a waveguide 10 is arranged substantially perpendicular to a virtual line between the source electrode 2 and the drain electrode 4. The waveguide 10 couples to the gap 6 and to the cluster 8 in the gap 6. In other words, there is a local coupling or an interaction of the cluster 8 with the waveguide 10 in the gap area 6.

Figure 3:
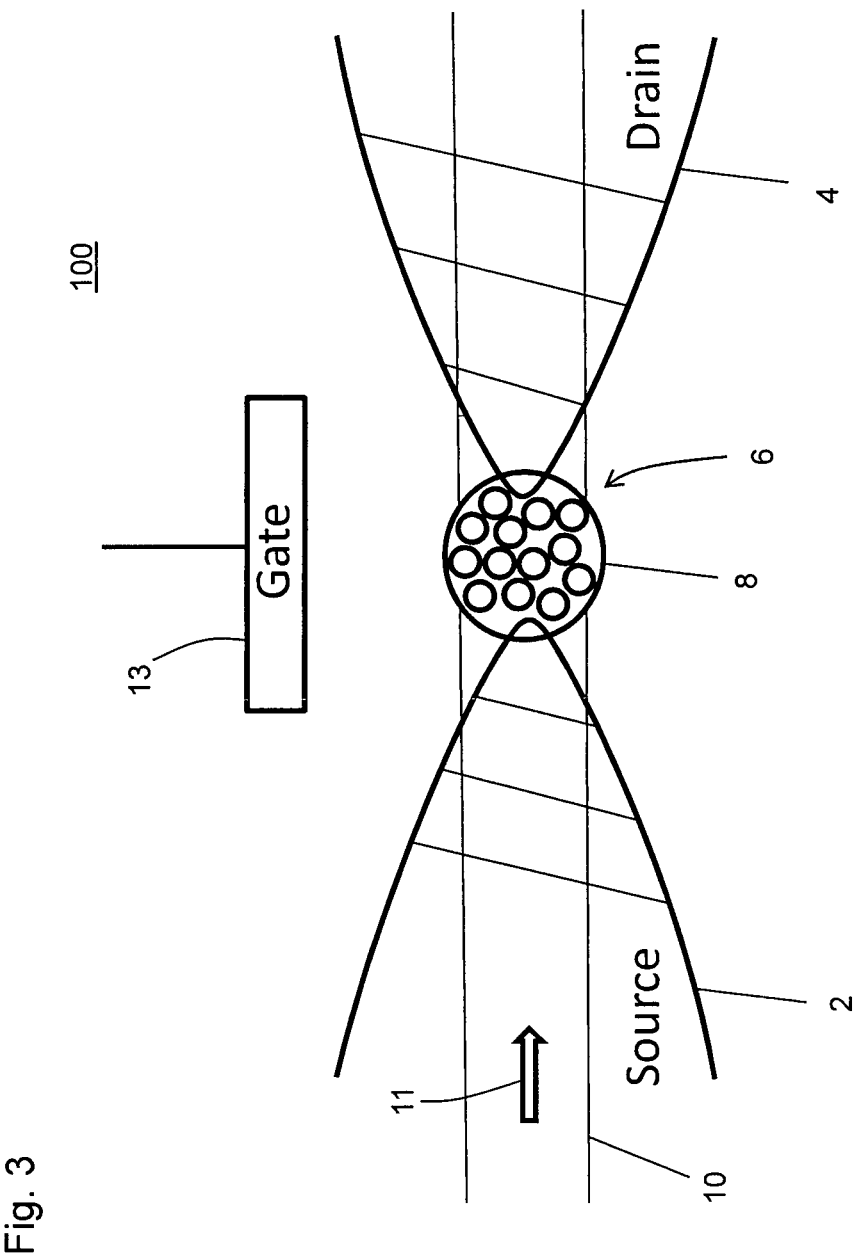
FIG. 3 shows a schematic representation of a parallel geometry of a device according to an exemplary embodiment.

FIG. 3 illustrates a schematic representation of a parallel geometry of a device 100 according to an exemplary embodiment of the present application. In this parallel geometry the source electrode 2 and the drain electrode 4 are on top or beneath/below the waveguide 10.

Further features, aspects and embodiments are provided below in the following items:

Item 1: Device, particularly an optical and/or plasmonic device or switch or transistor, including at least three electrically conducting electrodes, the source electrode, the drain electrode and the control electrode or gate electrode, as well as a gap between the said source and drain electrodes and a switchable cluster, switchable between at least two states with different shape or size or structure or electrical or optical properties, the said cluster being either a movable or dissolvable or deformable or chemically or electrochemically changeable or reversibly dopable/de-dopable cluster, preferentially on the micrometer or nanometer scale or atomic or molecular scale, which can be moved, dissolved and deposited, deformed or chemically or electrochemically changed or reversibly doped or reversibly changed in its dopant concentration by means of changing the voltage applied to the gate electrode, the said cluster being positioned in the said gap between the source and the gate electrode, where the cluster is connecting or disconnecting the said source and drain electrodes and/or changing the electrical or optical or magnetic or structural properties of the gap depending on its state and an optical coupling element allowing to bring light into and out of the "gap" area where the source electrode, the drain electrode and the cluster meet and a detection system allowing to detect the changes in the optical or plasmonic properties—especially within or close to the contact area, i.e. near the location of the switchable cluster—due to the switching of the cluster between the two or more states.

Item 2: Device according to item 1, using a metal for at least one of the three electrodes or the cluster, the metal being e.g. one of the metals Ag, Au, Cu, Fe, Pb, Zn, Sn, Bi, Ni, Co or using other materials including optically switchable molecules, graphite, graphene, graphene derivatives or graphenoid systems or graphene intercalates, layered materials, intercalated layered materials, or chalcogenides.

Item 3: Device according to item 1 or 2, where the change of the size or shape or doping state is performed by means of changing the electrochemical potential in an electrochemical cell or system, within an electrolyte or a gel electrolyte or a solid electrolyte or a porous material filled with an electrolyte or a gel electrolyte or a solid electrolyte.

Item 4: Device according to any one of the preceding items, where the said change of the state of the cluster, especially the size or shape or doping state is induced by means of an electrical or a magnetic field.

Item 5: Device according to item 1 to 3, where the said cluster is consisting of one or few atoms or molecules which are moved in and out of the gap by means of a voltage applied to the said gate electrode or by means of an electrical or magnetic field or by radiation, especially electromagnetic radiation such as ultraviolet, visible or infrared light or microwave radiation.

Item 6: Device according to item 5, where the said radiation induces a resonant absorption or transition or isomerization or cis-trans-isomerization in the atom(s) or molecule(s) of the cluster.

Item 7: Device according to any one of items 1 to 6, where the said cluster is consisting of metal atom(s) or of one or more azobenze molecules of derivatives of these.

Item 8: Device according to any one of Items 1 to 7, where the said switching process of the cluster is performed by radiation, especially electromagnetic radiation such as ultraviolet, visible or infrared light or microwave radiation.

Item 9: Device according to any one of items 1 to 7, where the said switching process of the cluster is performed by radiation, especially electromagnetic radiation such as ultraviolet, visible or infrared light or microwave radiation and the resulting readout is performed by electrical measurement, e.g. by measuring or detecting of the conductance or the current between source and drain.

Item 10: Device according to any one of the preceding items, where the said switching process of the cluster is induced not by a voltage change applied at the gate electrode but by a voltage pulse.

Item 11: Device according to any one of the preceding items, where the said switching process of the cluster is performed by a voltage change or a voltage pulse applied to one or both of the said source electrode or drain electrode instead of or in addition to a voltage change or a voltage pulse applied at the gate electrode.

Item 12: Device according to any one of the preceding items, where there is no gate electrode, but only a source electrode and a drain electrode and the said switching process of the cluster is performed by a voltage change or a voltage pulse applied to one or both of the said source electrode or drain electrode.

Item 13: Device according to any one of the preceding items, where the said switching process of the cluster is performed within an electrochemical environment or in a gel or in a solid electrolyte, where there is no gate electrode, but only a source electrode and a drain electrode and the said switching process of the cluster is performed by a voltage change or a voltage pulse applied to one or both of the said source electrode or drain electrode and where, in a preferred version, there is an electrochemical reference electrode or quasi-reference electrode kept at a constant reference potential.

Item 14: Device according to any one of the preceding items, where the said switching process of the cluster is performed within an electrochemical environment and where the said switching process of the cluster is induced by a voltage change or a voltage pulse applied to an electrochemical the gate electrode which in a preferred version also serves as an electrochemical reference electrode.

Item 15: Device according to any one of the preceding items, where the said switching process of the cluster is achieved by using an electrical signal and the readout is performed optically or where the said switching process of the cluster is achieved by using an optical signal or other radiation and the readout is performed optically or where the said switching process of the cluster is achieved by using an optical signal or other radiation and the readout is performed electrically or where the said switching process of the cluster is achieved by using an optical signal or other radiation and a molecule or molecules in the gap absorbing the said radiation or part of it and inducing either a mechanical change or a conformation change or an isomeric change (from cis to trans configuration and/or vice versa) or a conductance change or other changes in molecular properties.

Item 16: Device according to any one of items 1 to 14, where the said switching process of the cluster is achieved by using a magnetic field and the readout is performed optically.

Item 17: Device according to any one of items 1 to 14, where the said switching process of the cluster is achieved by using a magnetic field and the readout is performed optically and electrically.

Item 18: Device according to any one of items 1-14, where the said switching process of the cluster is achieved by using a magnetic field and the readout is performed electrically.

Item 19: Device according to any one of the preceding items where the optical detection and/or readout of the change of the contacting atom or cluster is performed by detecting a change in the polarization or the absorbance or the amplitude or the frequency of the optical properties—for example the plasmon resonance or one of several plasmon resonances—of the source-drain contact area or the contacting cluster area or a combination of these.

Item 20: The application of the said device according to any one of the preceding items as a transistor, as a data storage device or as a compound in micro- and nanoelectronic or photonic or plasmonic circuits or in logical circuits or as a combination of two or more of the said devices of any one of the preceding items for electronic circuits or logical devices and circuits.

REFERENCES

1. H. Gleiter, Th. Schimmel, H. Hahn: "Nanostructured solids—From nano-glasses to quantum transistors", Nano Today, 9 (1), 17-68 (2014).
2. R. Maul, F.-Q. Xie, C. Obermair, G. Schön, Th. Schimmel, W. Wenzel: "Memory effects in electrochemically gated metallic point contacts", Applied Physics Letters 100 (20), 203511 (2012).
3. Ch. Obermair, A. Wagner, Th. Schimmel: "The atomic force microscope as a mechano-electrochemical pen", Beilstein Journal of Nanotechnology 2, 659-664 (2011).
4. Ch. Obermair, H. Kuhn, Th. Schimmel: "Lifetime analysis of individual-atom contacts and crossover to geometric-shell structures in unstrained silver nanowires", Beilstein Journal of Nanotechnology 2, 740-745 (2011).
5. F.-Q. Xie, R. Maul, C. Obermair, W. Wenzel, G. Schön, Th. Schimmel: "Multi-Level Atomic-Scale Transistors based on Metallic Quantum Point Contacts", Advanced Materials 22 (18), 2033-2036 (2010).
6. C. Obermair, F.-Q. Xie, Th. Schimmel: "The Single-Atom Transistor: Perspectives for Quantum Electronics on the Atomic-Scale", Europhysics News, Invited Article, 41 (4), July-August (2010).
7. S. Zhong, P. Dupeyrat, R. Groeger, M. Wang, T. Koch, Th. Schimmel: "Periodical Nanostructured Multiline Copper Films Self-Organized by Electrodeposition: Structure and Properties", Journal of Nanoscience and Nanotechnology 10 (9), 6144-6149 (2010).
8. S. Zhong, D. Wang, T. Koch, M. Wang, S. Walheim, Th. Schimmel: "Growth and Branching Mechanisms of Electrochemically Self-Organized Mesoscale Metallic Wires", Crystal Growth & Design 10 (4), 1455-1459 (2010).
9. F.-Q. Xie, F. Hüser, F. Pauly, C. Obermair, G. Schön, Th. Schimmel: "Conductance of atomic-scale Pb contacts in an electrochemical environment", Phys. Rev. B 82, 075417-1-5 (2010).
10. S. Zhong, Th. Koch, M. Wang, T. Scherer, S. Walheim, H. Hahn, Th. Schimmel: "Nanoscale Twinned Copper Nanowire Formation by Direct Electrodeposition", Small 5 (20), 2265-2270 (2009).
11. Ch. Obermair, F.-Q. Xie, R. Maul, W. Wenzel, G. Schön, Th. Schimmel: "Single-atom transistors: switching an electrical current with individual atoms", Invited Article, In: H. Hahn, A. Sidorenko, I. Tiginyanu (Eds.) Nanoscale Phenomena—Fundamentals and Applications, Springer Serie: Nanoscience and Technology, Heidelberg, Dordrecht, London, New York, 2009, pp. 113-124.
12. Ch. Obermair, F.-Q. Xie, Th. Schimmel: "The Single-Atom Transistor: Quantum Electronics at Room Temperature", IEEE NANO 2009 and IEEE Xplore database, (2009).
13. F.-Q. Xie, R. Maul, A. Augenstein, C. Obermair, E. B. Starikov, G. Schön, Th. Schimmel, W. Wenzel: "Independently switchable atomic quantum transistors by reversible contact reconstruction", Nano Lett. 8 (9), 2944-2948 (2008).
14. F. Xie, R. Maul, C. Obermair, E. B. Starikov, W. Wenzel, G. Schön, Th. Schimmel: "Pre-selectable integer quantum conductance of electrochemically fabricated silver point contacts", Applied Physics Letters 93 (4), 043103 (2008).
15. Th. Schimmel, F.-Q. Xie and C. Obermair: "Quantenelektronik: Weltweit erster atomarer Transistor", Elektronik 55 (20), 14-17 (2006).
16. F. Xie, C. Obermair, Th. Schimmel: "Elektrische Ströme schalten mit einzelnen Atomen", Physik i. u. Z. 6, 159-160 (2006).
17. Th. Schimmel, F.-Q. Xie, C. Obermair: "Atomare Elektronik: Mit einzelnen Atomen elektrische Ströme schalten", Spezial Nanotechnik in: Photonik 6, Dezember 2005.
18. Ch. Obermair, R. Kniese, F.-Q. Xie, and Th. Schimmel: "Quantized Conductance in Atomic-Scale Point Contacts Formed by Local Electrochemical Deposition of Silver", Invited Paper in: Molecular Nanowires and other Quantum Objects, Eds. A. S. Alexandrov, J. Demsar, and I. K. Yanson, NATO Science Series: II, Mathematics, Physics and Chemistry (Kluwer Academic Press, Dordrecht 2004) 233-242.
19. F.-Q. Xie, C. Obermair, and Th. Schimmel: "Nanotechnologie—Vorstoß in atomare Dimensionen", Erdöl, Erdgas, Kohle 12, 542-546 (2002); eingeladener Artikel
20. "Switching an Electrical Current with Atoms: the Reproducible Operation of a Multi-Atom Relay", Solid State Communications 132, 437-442 (2004).
21. F. Q. Xie, L. Nittler, Ch. Obermair, and Th. Schimmel: "Gate-controlled atomic quantum switch", Physical Review Letters 93(12), 128303 (2004).
22. J. Scholl, A. Koh, and J. Dionne: "Quantum plasmon resonances of individual metallic nanoparticles", Nature 483, 421 (2012).
23. K. Savage, M. Hawkaye, R. Esteban, A. Borisov, J. Aizpurua, and J. Baumberg: "Revealing the quantum regime in tunneling plasmonics", Nature 491, 574 (2012).
24. A. Aubry, D. Lei, S. Maier, and J. Pendry: "Interaction between plasmonic nanoparticles revisited with transformation optics", Phys. Rev. Lett. 233901 (2010).

LIST OF REFERENCE NUMERALS 2 source electrode
4 drain electrode
6 gap/gap area
8 cluster/contacting (cluster of) atoms or molecules
10 optical coupling element/fiber optics/waveguide
11 light/light coming into gap region
12 light/light coming from gap region
13 gate electrode
15 detection system/optical detection
100 device/optical device/plasmonic switch/plasmonic transistor

The invention claimed is:

1. An optical device, including:
at least three electrically conducting electrodes, comprising a source electrode, a drain electrode and a control electrode or gate electrode arranged so that a gap is formed between the source electrode and the drain electrode;
a switchable cluster that is switchable between two or more states, each state having different shape or size or structure or electrical or optical properties, wherein:
the cluster is a movable cluster or a dissolvable cluster or a deformable cluster or a chemically or electrochemically changeable cluster or a reversibly dopable/de-dopable cluster, wherein the cluster can be moved, dissolved and deposited, deformed or chemically or electrochemically changed or reversibly doped or reversibly changed in its dopant concentration in response to a change in a voltage applied to the gate electrode,
the cluster is positioned in the gap between the source and the gate electrodes, such that the cluster connects or disconnects the source and drain electrodes and/or changes the electrical or optical or magnetic or structural properties of the gap depending on its state;
an optical coupling element configured to selectively allow light into and out of the gap area where the source electrode, the drain electrode and the cluster meet; and
a detection system configured to detect changes in optical or plasmonic properties of the gap area due to the switching of the cluster between the two or more states.

2. A device according to claim 1,
wherein at least one of the three electrodes or the cluster comprises a metal, or
wherein at least one of the three electrodes or the cluster comprises optically switchable molecules, graphite, graphene, graphene derivatives or graphenoid systems or graphene intercalates, layered materials, intercalated layered materials, or chalcogenides.

3. A device according to claim 1, wherein the cluster comprises an electrochemical cell or system and the cluster is adapted to change its state in response to a change in an electrochemical potential in the electrochemical cell or system,
wherein the electrochemical cell or system comprises an electrolyte, a gel electrolyte, a solid electrolyte, or a porous material filled with an electrolyte, a gel electrolyte, or a solid electrolyte.

4. A device according to claim 1, wherein the cluster is adapted to change its state in response to a change in an electrical or a magnetic field.

5. A device according to claim 1, wherein the cluster comprises one or more atoms or molecules which are moved in and out of the gap in response to a voltage applied to the gate electrode, an electrical or magnetic field, or by radiation.

6. A device according to claim 5, wherein the radiation induces a resonant absorption or transition or isomerization or cis-trans-isomerization in at least one of the one or more atoms or molecules of the cluster.

7. A device according to claim 1, wherein the cluster consists of one or more metal atoms or of one or more azobenze molecules or derivatives of these.

8. A device according to claim 1, wherein a switching process of the cluster is performed by radiation.

9. A device according to claim 8, wherein the detection system is adapted to perform a resulting readout representing an electrical measurement.

10. A device according to claim 1, wherein a switching process of the cluster is induced by a voltage pulse at the gate electrode.

11. A device according to claim 1, wherein a switching process of the cluster is performed in response to a voltage change or a voltage pulse applied to one or both of the source electrode and the drain electrode instead of or in addition to a voltage change or a voltage pulse applied at the gate electrode.

12. A device according to claim 1, wherein a switching process of the cluster is performed within an electrochemical environment and wherein the switching process of the cluster is induced by a voltage change or a voltage pulse applied to the gate electrode.

13. A device according to claim 1,
wherein a switching process of the cluster is achieved by using an electrical signal and the readout is performed optically, or
wherein the switching process of the cluster is achieved by using an optical signal or other radiation and the readout is performed optically, or
wherein the switching process of the cluster is achieved by using an optical signal or other radiation and the readout is performed electrically, or
wherein the switching process of the cluster is achieved by using an optical signal or other radiation and a molecule or molecules in the gap absorbing the radiation or part of the radiation and inducing either a mechanical change, a conformation change, an isomeric change, a conductance change, or other changes in molecular properties.

14. A device according to claim 1, wherein a switching process of the cluster is achieved by using a magnetic field and the readout is performed optically.

15. A device according to claim 1, wherein a switching process of the cluster is achieved by using a magnetic field and the readout is performed optically and electrically.

16. A device according to claim 1, wherein the switching process of the cluster is achieved by using a magnetic field and the readout is performed electrically.

17. A device according to claim 1, wherein an optical detection and/or readout of a change of the cluster is performed by detecting a change in a polarization, an absorbance, an amplitude, or a frequency of the optical properties and/or a change in a plasmon resonance or one of several plasmon resonances, of a source-drain contact area or the gap area, or a combination of these.

18. An optical device, comprising:
a source electrode;
a drain electrode;
a gap area between the source electrode and the drain electrode;
a cluster being positioned in the gap area for connecting and disconnecting the source electrode and the drain electrode and for changing optical and/or plasmonic properties of the gap area; and
an optical coupling element configured to selectively allow light into and out of the gap area.

19. An optical device according to claim 18,
wherein the cluster comprises one or more atoms and/or molecules, or
wherein the cluster is a cluster of atoms and/or molecules.

20. An optical device according to claim 18,
wherein the cluster is configured to adopt at least two different states which can be switched by an electrical and/or optical signal and/or by a magnetic and/or electromagnetic field and/or by a mechanical and/or piezo-mechanical deformation of the cluster and/or by chemical and/or electrochemical influences.

21. An optical device according to claim 18, wherein the optical coupling element comprises fiber optics and/or a waveguide.

22. An optical device according to claim 18, further comprising a gate electrode configured to change or switch a state of the cluster.

23. An optical device according to claim 18, further comprising
a detection system configured to detect changes of the optical and/or plasmonic properties of the gap area.

24. An optical device according to claim 23,
wherein the detection system is adapted to optically read out a state of the cluster, and/or
wherein the detection system comprises an optical detector and/or a color filter and/or an edge filter and/or a band-pass filter and/or a polarizer and/or a spectral analyzer.

25. An optical device according to claim 18, wherein the device is:
a transistor,
a data storage device,
a component in a micro-electronic circuit,
a component in a nanoelectronic circuit,
a component in a photonic circuit,
a component in a plasmonic circuit, or
a component in a logical circuit.

26. An optical device according to claim 25, wherein the micro-electronic circuit, nanoelectronic circuit, photonic circuit, plasmonic circuit, or logical circuit includes two or more of the optical devices.

27. An optical device, including:
at least two electrically conducting electrodes, comprising a source electrode and a drain electrode arranged so that a gap is formed between the source electrode and the drain electrode;
a switchable cluster that is switchable between two or more states, each state having different shape or size or structure or electrical or optical properties, wherein:
the cluster is a movable cluster or a dissolvable cluster or a deformable cluster or a chemically or electrochemically changeable cluster or a reversibly dopable/de-dopable cluster, wherein the cluster can be moved, dissolved and deposited, deformed or chemically or electrochemically changed or reversibly doped or reversibly changed in its dopant concentration,
the cluster is positioned in the gap such that the cluster connects or disconnects the source and drain electrodes and/or changes the electrical or optical or magnetic or structural properties of the gap depending on its state;
a switching process of the cluster is performed by a voltage change or a voltage pulse applied to one or both of the source electrode and the drain electrode;
an optical coupling element configured to selectively allow light into and out of the gap area where the source electrode, the drain electrode and the cluster meet; and
a detection system configured to detect changes in optical or plasmonic properties of the gap area due to the switching of the cluster between the two or more states.

28. A device according to claim 27, wherein the switching process of the cluster is performed within an electrochemical environment or in a gel or in a solid electrolyte.

* * * * *